United States Patent
Saito et al.

(10) Patent No.: US 10,786,837 B2
(45) Date of Patent: Sep. 29, 2020

(54) METHOD FOR CLEANING CHAMBER OF SUBSTRATE PROCESSING APPARATUS

(71) Applicant: TOKYO ELECTRON LIMITED, Tokyo (JP)

(72) Inventors: Yukimasa Saito, Yamanashi (JP); Toshiki Hinata, Yamanashi (JP); Kazuya Dobashi, Yamanashi (JP); Kyoko Ikeda, Yamanashi (JP); Shuji Moriya, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 276 days.

(21) Appl. No.: 15/779,894

(22) PCT Filed: Oct. 20, 2016

(86) PCT No.: PCT/JP2016/081058
§ 371 (c)(1),
(2) Date: May 30, 2018

(87) PCT Pub. No.: WO2017/094388
PCT Pub. Date: Jun. 8, 2017

(65) Prior Publication Data
US 2018/0369881 A1 Dec. 27, 2018

(30) Foreign Application Priority Data
Nov. 30, 2015 (JP) .................. 2015-233379

(51) Int. Cl.
*B08B 9/00* (2006.01)
*H01L 21/67* (2006.01)
(Continued)

(52) U.S. Cl.
CPC ............ *B08B 9/00* (2013.01); *C23C 16/4401* (2013.01); *C23C 16/4412* (2013.01);
(Continued)

(58) Field of Classification Search
CPC ....... B08B 9/00; B08B 5/02; C23C 16/45563; C23C 16/4412; C23C 16/4401;
(Continued)

(56) References Cited

U.S. PATENT DOCUMENTS 9,263,223 B2 *  2/2016  Duerr .................... H01J 27/026
2008/0317975 A1   12/2008  Furui et al.
(Continued)

FOREIGN PATENT DOCUMENTS

JP   2009176886 A  *  8/2009
JP   2013-26327 A      2/2013
(Continued)

OTHER PUBLICATIONS

International Search Report dated Nov. 22, 2016 in PCT/JP2016/081058.

*Primary Examiner* — Alexander Markoff
(74) *Attorney, Agent, or Firm* — Rothwell, Figg, Ernst & Manbeck, P.C.

(57) ABSTRACT

According to the present invention, a substrate processing apparatus has a chamber (1), a stage (4) for holding a substrate (W) to be processed in the chamber (1), and a nozzle part (13) from which a gas cluster is blasted onto the substrate (W) to be processed, and has a function for processing the substrate (W) to be processed by the gas cluster. Cleaning of the inside of the chamber (1) is performed by: placing a prescribed reflecting member (dW, 60) in the chamber (1), blasting a gas cluster (C) onto the reflecting member (dW, 60), and applying the gas-cluster flow reflected by the reflecting member (dW, 60) onto a wall section of the chamber (1) to remove particles (P) adhered to the wall section of the chamber (1).

12 Claims, 3 Drawing Sheets

(51) Int. Cl.
  *H01L 21/02*    (2006.01)
  *H01L 21/687*   (2006.01)
  *C23C 16/455*   (2006.01)
  *C23C 16/44*    (2006.01)
  *B08B 5/02*     (2006.01)

(52) U.S. Cl.
  CPC .. *C23C 16/45563* (2013.01); *C23C 16/45589* (2013.01); *H01L 21/02057* (2013.01); *H01L 21/67028* (2013.01); *H01L 21/68764* (2013.01); *B08B 5/02* (2013.01)

(58) Field of Classification Search
  CPC ......... C23C 16/45589; H01L 21/02057; H01L 21/67028; H01L 21/68764
  See application file for complete search history.

(56) References Cited

U.S. PATENT DOCUMENTS

| | | | | |
|---|---|---|---|---|
| 2013/0056033 A1* | 3/2013 | Matsui | ............ | H01L 21/67028 134/19 |
| 2015/0027501 A1* | 1/2015 | Dobashi | ............ | H01L 21/67028 134/31 |
| 2015/0052702 A1* | 2/2015 | Dobashi | ............ | H01L 21/02057 15/303 |
| 2015/0255316 A1* | 9/2015 | Dobashi | ............. | H01L 21/0209 134/37 |
| 2015/0376791 A1* | 12/2015 | Gluschenkov | .......... | C23C 16/42 156/345.29 |
| 2016/0001334 A1* | 1/2016 | Dobashi | ............ | H01L 21/67028 134/1 |
| 2016/0071723 A1* | 3/2016 | Gluschenkov | .... | C23C 16/45523 438/712 |
| 2017/0207076 A1* | 7/2017 | Dobashi | .................... | G03F 7/42 |
| 2018/0015510 A1* | 1/2018 | Dobashi | ................ | H01J 37/321 |

FOREIGN PATENT DOCUMENTS

| | | | |
|---|---|---|---|
| JP | 2015-26745 | A | 2/2015 |
| JP | 2015-41646 | A | 3/2015 |
| JP | 2015167173 | A * | 9/2015 |
| TW | 201213603 | A | 4/2012 |

* cited by examiner

US 10,786,837 B2

METHOD FOR CLEANING CHAMBER OF SUBSTRATE PROCESSING APPARATUS

CROSS REFERENCE TO RELATED APPLICATION

This application is a 35 U.S.C. 371 National Phase Entry Application from PCT/JP2016/081058, filed Oct. 20, 2016, which claims priority to Japanese Patent Application No. 2015-233379, filed Nov. 30, 2015, the disclosures of which are incorporated herein in their entirety by reference, and priority is claimed to each of the foregoing.

TECHNICAL FIELD

The present disclosure relates to a method for cleaning a chamber of a substrate processing apparatus of processing a substrate by blasting a gas cluster.

BACKGROUND

In a semiconductor manufacturing process, adhesion of particles to a substrate is one of major factors affecting the yield of products. Therefore, a cleaning processing is performed on the substrate to remove particles.

As a technology that removes particles adhered to a substrate in a semiconductor manufacturing process, in the related art, two-fluid cleaning and aerosol cleaning using, for example, Ar or $N_2$ have been adopted, but these technologies have difficulty in coping with miniaturization of recent semiconductor devices.

Therefore, a substrate cleaning technology using a gas cluster shower (GCS) as a device capable of enabling cleaning even within a fine pattern has attracted attention (e.g., Patent Documents 1 to 3).

PRIOR ART DOCUMENT

Patent Document

Patent Document 1: Japanese Patent Laid-Open Publication No. 2013-026327
Patent Document 2: Japanese Patent Laid-Open Publication No. 2015-026745
Patent Document 3: Japanese Patent Laid-Open Publication No. 2015-041646

DISCLOSURE OF THE INVENTION

However, in such a substrate cleaning technology using a GCS, it has been found that particles removed from a substrate adhere to the wall of a chamber and the adhered particles re-adhere to a substrate during the next substrate processing, thus contaminating the substrate.

Therefore, it is an object of the present disclosure to provide a method for cleaning a chamber of a substrate processing apparatus, which is capable of effectively removing particles adhered to the inner wall of the chamber in the substrate processing apparatus that performs a substrate cleaning processing using a gas cluster shower.

According to a first aspect of the present disclosure, there is provided a method for cleaning an inside of a chamber of a substrate processing apparatus that includes a chamber, a stage configured to hold a processing target substrate thereon in the chamber, and a nozzle unit configured to blast a gas cluster to the processing target substrate, and has a function of processing the processing target substrate by the gas cluster. The method includes: placing a predetermined reflecting member in the chamber; and removing particles adhered to the wall of the chamber by blasting the gas cluster to the reflecting member to generate a gas stream, and bringing the gas stream, reflected from the reflecting member, into contact with a wall of the chamber.

According to a second aspect of the present disclosure, there is provided a method for cleaning an inside of a chamber of a substrate processing apparatus that includes a chamber, a stage configured to hold a processing target substrate thereon in the chamber, and a nozzle unit configured to blast a gas cluster to the processing target substrate, and has a function of processing the processing target substrate by the gas cluster. The method includes: a first stage including placing a predetermined reflecting member in the chamber, and removing particles adhered to the wall of the chamber by blasting the gas cluster to the reflecting member to generate a gas stream, and bringing the gas stream reflected from the reflecting member into contact with a wall of the chamber; and a second stage including discharging the removed particles from the chamber.

A first process of the first aspect or the second aspect may be configured as in any of the following processes (a) to (c):

(a) a dummy substrate is placed on the stage as the reflecting member, and particles adhered to a sidewall of the chamber is removed by blasting the gas cluster to the dummy substrate while moving the stage up and down, and bringing the gas stream, reflected from the dummy substrate, into contact with the sidewall of the chamber.

(b) a deformed reflecting plate is rotatably placed in the chamber as the reflecting member, and particles on an inner wall of the chamber are removed by blasting the gas cluster from the nozzle unit to the reflecting plate while rotating the reflecting plate and moving the nozzle unit, and bringing the gas stream, reflected from the reflecting plate in various directions, into contact with an entire inner wall of the chamber.

(c) as the reflecting member, a dummy substrate is placed on the stage and a deformed reflecting plate is rotatably placed in the chamber, and removing particles adhered to a side wall of the chamber by blasting the gas cluster to the dummy substrate while moving the stage up and down and bringing the gas stream, reflected from the dummy substrate, into contact with a sidewall of the chamber, and removing particles on an inner wall of the chamber by blasting the gas cluster from the nozzle unit to the reflecting plate while rotating the reflecting plate and moving the nozzle unit, and bringing the gas stream, reflected from the reflecting plate in various directions, into contact with the entire inner wall of the chamber are both performed.

In the second aspect, the second process may be performed by purging and evacuation in the chamber, and may be performed by cycle purging of repeating a process of raising a pressure by introducing a purge gas into the chamber and a process of vacuum-evacuating the inside of the chamber plural times, or by a high flow-rate purging of controlling the inside of the chamber to a predetermined pressure or higher by introducing the purge gas at a high flow rate into the chamber, and thereafter evacuating the inside of the chamber.

The second process may be performed by disposing a dummy substrate in the chamber in a non-grounded state or in a minus-charged or plus-charged state, blasting the gas cluster or gas stream from the nozzle unit to the wall of the chamber, adsorbing particles in the chamber to the dummy substrate, and recovering the dummy substrate from the chamber. In addition, the evacuation and purging and the adsorption of particles to the dummy substrate may be both performed. In addition, the first stage and the second stage may be repeated plural times.

The present disclosure removes particles adhered to a wall of a chamber by providing a predetermined reflecting member in the chamber, blasting a gas cluster to the reflecting member, and bringing a gas stream, reflected from the reflecting member, into contact with the wall of the chamber. Therefore, since the gas stream may be brought into contact with the chamber wall with moderate energy, it is possible to effectively remove particles adhered to the wall of the chamber without causing damage to the wall surface.

In addition, the inside of the chamber may be cleaned by performing the first stage and the second stage of discharging the removed particles from the chamber.

DETAILED DESCRIPTION TO EXECUTE THE INVENTION

Hereinafter, exemplary embodiments of the present disclosure will be described with reference to the accompanying drawings.

<Substrate Processing Apparatus>

Figure 1:
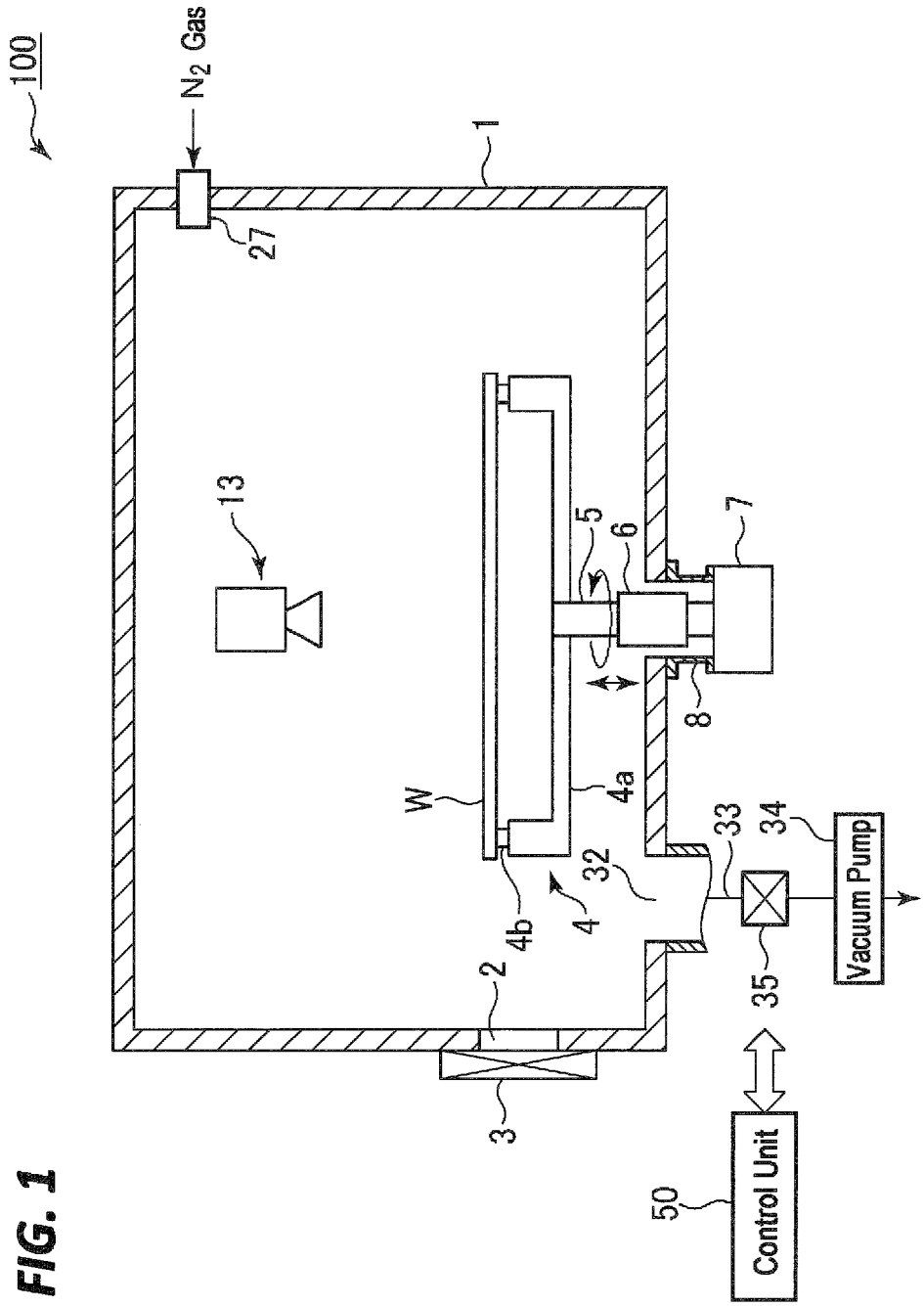
FIG. 1 is a cross-sectional view illustrating a substrate processing apparatus in which a cleaning method of the present disclosure is performed.

FIG. 1 is a cross-sectional view illustrating a substrate processing apparatus in which a cleaning method of the present disclosure is performed.

The substrate processing apparatus 100 performs a cleaning processing on a semiconductor wafer (hereinafter briefly referred to as a wafer), which is a processing target substrate. The substrate processing apparatus 100 includes a cylindrical chamber 1, which defines a processing room for performing a cleaning processing. The side surface of the chamber 1 is formed with a transfer port 2 for performing the carry-in/out of a wafer W, and a gate valve 3 is provided in the transfer port 2 to open and close the transfer port 2.

At the center of the bottom in the chamber 1, a rotary stage 4, on which the wafer W as a processing target substrate is disposed in a horizontal posture, is provided. A motor 6 is connected to the rotary stage 4 via a rotating shaft 5, and the motor 6 is moved up and down by an elevating mechanism 7. Thereby, the rotary stage 4 is rotated and moved up and down. A space between the bottom of the chamber 1 and the elevating mechanism 7 is sealed with a seal member 8. The rotary stage 4 includes three (two in the drawing) arms 4a extending from the center and a wafer support portion 4b at the outer end of each arm.

Above the rotary stage 4, a nozzle unit 13 is provided to blast a gas cluster to the wafer W. The nozzle unit 13 is moved on the wafer W, which is disposed on the rotary stage 4, by a nozzle moving member (not illustrated). The nozzle moving member pivots the nozzle unit 13 on the wafer W.

A cleaning gas (cluster generation gas) is supplied to the nozzle unit 13 through a pipe (not illustrated), which is provided in the nozzle moving member.

The nozzle unit 13 discharges the cleaning gas from a region having a higher pressure than the processing atmosphere in the chamber 1 toward the wafer W in the chamber 1, and generates a gas cluster that is an aggregate of atoms or molecules of the cleaning gas via adiabatic expansion. The generated gas cluster is blasted substantially perpendicularly toward the wafer W.

A purge gas nozzle 27 is provided on an upper portion of the sidewall of the chamber 1, and for example, $N_2$ gas is supplied as a purge gas to the purge gas nozzle 27 through a pipe (not illustrated). The $N_2$ gas as the purge gas is introduced from the purge gas nozzle 27 into the chamber 1. The pipe is provided with an opening/closing valve (not illustrated).

An exhaust port 32 is formed in the bottom of the chamber 1, and an exhaust pipe 33 is connected to the exhaust port 32. A vacuum pump 34 is provided in the exhaust pipe 33, and the inside of the chamber 1 is vacuum-evacuated by the vacuum pump 34. The degree of vacuum at this time is controllable by a pressure control valve 35, which is provided in the exhaust pipe 33. An exhaust mechanism is configured with these components, and the inside of the chamber 1 is maintained at a predetermined degree of vacuum by the exhaust mechanism.

The substrate processing apparatus 100 includes a control unit 50, which controls each component of the substrate processing apparatus 100. The control unit 50 includes a controller having a microprocessor (computer), which controls, for example, the supply of gas of the substrate processing apparatus 100, the evacuation of gas, and the driving control of the rotary stage 4. The controller is connected to, for example, a keyboard, which allows an operator to perform, for example, a command input operation in order to manage the substrate processing apparatus 100, or a display, which visualizes and displays an operating status of the substrate processing apparatus 100. In addition, the controller is connected to a storage unit, which stores, for example, a processing recipe, which is a control program for realizing a processing in the substrate processing apparatus 100 by control of the controller or a control program for causing each component of the substrate processing apparatus 100 to execute a predetermined processing based on a processing condition, or various databases. Then, if necessary, a desired cleaning processing is performed in the substrate processing apparatus 100 under the control of the controller by calling an arbitrary recipe from the storage unit and causing the controller to execute the recipe.

In the substrate processing apparatus 100 configured as described above, first, the gate valve 3 is opened so that the wafer W as a processing target substrate is carried into the chamber 1 through the carry-in/out port 2, and the wafer W is disposed on the rotary stage 4 by upward and downward movement of the rotary stage 4. Next, the nozzle unit 13 is positioned, for example, above the center portion of the wafer W, and while a gas cluster is blasted based on the center portion as a blasting start position of the gas cluster, a blasting position is moved to the peripheral edge side of the wafer W. At this time, the wafer W is rotated at a rotational speed of, for example, 20 rpm to 200 rpm by the rotary stage 4. The blasting position of the gas cluster may be continuously moved from the center portion to the peripheral portion of the wafer W, or may be moved sequentially and intermittently from the center portion to the peripheral edge of the wafer W. By adjusting the movement speed of the nozzle unit 13 and the rotational speed of the wafer W, the gas cluster is blasted to the entire surface of the wafer W.

Meanwhile, the supply pressure of the cleaning gas supplied to the nozzle unit 13 may be raised by a pressure raising mechanism such as a booster. In addition, a filter may be provided to remove impurities in the gas.

<Cleaning Method of Substrate Processing Apparatus>

Next, a chamber cleaning method of the substrate processing apparatus 100 as described above will be described.

In the substrate processing apparatus 100 as described above, it has been revealed that, when particles of a circuit pattern of the wafer W are removed by a gas cluster, the particles removed from the wafer W adhere to the wall of the chamber 1, and the adhered particles re-adhere to the wafer W during a next substrate cleaning processing, thus causing substrate contamination.

As a result of investigating a method of effectively removing such particles adhered to the chamber 1, it has been found that it is possible to easily and effectively remove the particles in the chamber 1 by using a gas cluster used for a cleaning processing of the substrate processing apparatus 100.

However, as described above, since the substrate processing apparatus 100 of the present exemplary embodiment blasts a gas cluster to the wafer W as a processing target substrate, it is difficult to remove the adhered particles by directly blasting the gas cluster to an arbitrary position on the wall of the chamber 1. In addition, even if it may be possible to blast a gas cluster to the wall of the chamber 1, there is a risk of damage to the wall surface of the chamber 1 depending on the energy of the gas cluster.

(Removal Processing)

Therefore, the present exemplary embodiment adopts, as a processing of removing particles on the wall of the chamber, a method of providing a predetermined reflecting member in the chamber 1, blasting a gas cluster to the reflecting member, and bringing a gas stream, reflected from the reflecting member, into contact with the chamber 1. Thereby, since the gas stream may be brought into contact with the chamber wall with moderate energy, it is possible to effectively remove particles adhered to the wall of the chamber without causing damage to the wall surface.

Specifically, the following first removal processing or second removal processing is performed according to a site of the chamber to be removed or a required removal force.

1. First Removal Processing

Figure 2:
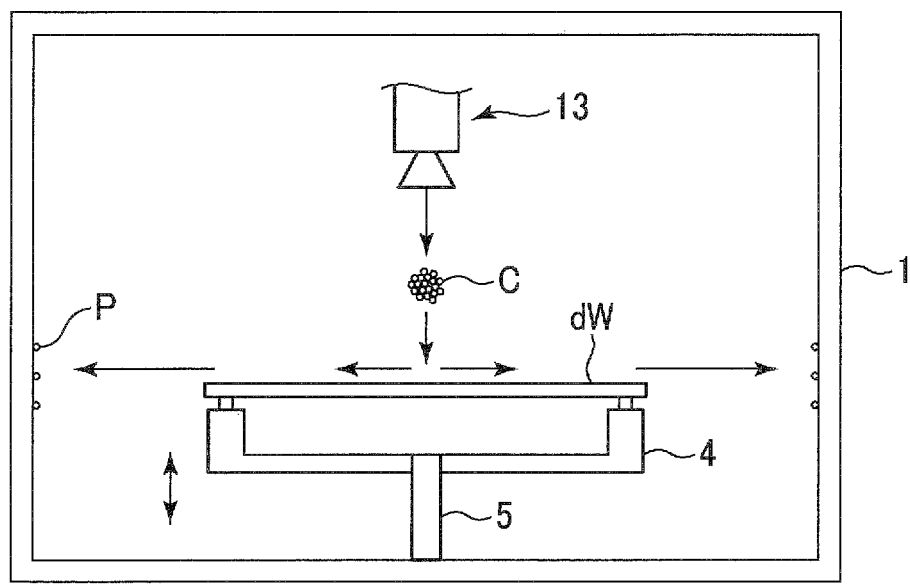
FIG. 2 is a cross-sectional view for explaining a first removal processing in the chamber cleaning method of the substrate processing apparatus.

As illustrated in FIG. 2, a first removal processing includes providing a dummy wafer dW as a reflecting member on the rotary stage 4 and blasting a gas cluster C from the nozzle unit 13 to the dummy wafer dW while moving the rotary stage 4 up and down. Thereby, the blasted gas cluster collides with and is destroyed by the dummy wafer dW, and is reflected from the dummy wafer dW, thereby becoming a high-speed horizontal gas stream. By bringing the high-speed horizontal gas stream into contact with the side wall of the chamber 1, that portion is cleaned.

Normally, the reason why a large amount of particles adheres to the wall of the chamber 1 is because a portion of the sidewall corresponds to the wafer. By bringing the high-speed gas stream reflected in the horizontal direction from the dummy wafer dW into contact with the sidewall, it is possible to effectively remove particles P on the sidewall.

2. Second Removal Processing

Figure 3:
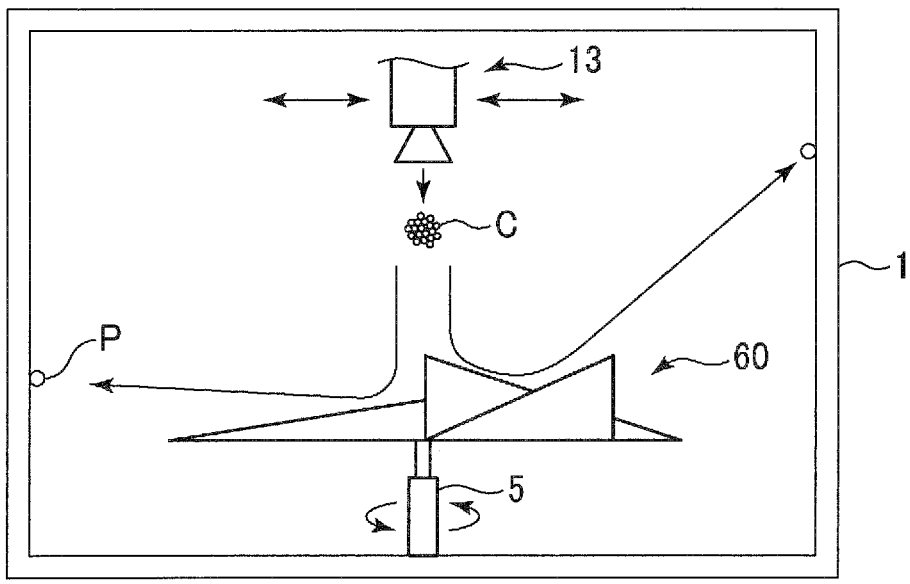
FIG. 3 is a cross-sectional view for explaining a second removal processing in the chamber cleaning method of the substrate processing apparatus.

As illustrated in FIG. 3, a second method includes attaching, as a reflecting member, a deformed reflecting plate 60, the reflection direction of which is changeable in various directions, to the rotating shaft 5, and blasting a gas cluster from the nozzle unit 13 to the reflecting plate 60 while rotating the reflecting plate 60 and also scanning the nozzle unit 13. Thereby, the blasted gas cluster collides with and is destroyed by the reflecting plate 60, thereby becoming gas streams reflected by the reflecting plate 60 in various directions. By bringing the gas streams reflected in various directions into contact with the entire inner wall of the chamber 1, cleaning of the inner wall in the chamber 1 is performed.

Since this second removal processing may bring the gas streams into contact with a portion that the gas streams cannot be brought into contact in the first removal processing, the second removal processing is suitable for a case of removing all of the particles P over the entire inner wall of the chamber 1. However, since the flow rate of the gas streams in the second removal processing is slower than that in the first removal processing, the removal rate of particles is lower than that in the first removal processing in a portion of the sidewall of the chamber 1 corresponding to the wafer, to which a large amount of particles adhere.

Therefore, the first removal processing and the second removal processing may be combined with each other. In this case, the second removal processing may be performed after the first removal processing is performed, or the first removal processing may be performed after the second removal processing is performed.

(Discharge of Particles)

1. Evacuation and Purging

After removing particles on the inner wall of the chamber 1 as described above, it is necessary to discharge the particles to the outside of the chamber. The particles are discharged to some extent by simply evacuating the inside of the chamber. However, in order to sufficiently discharge the particles, both purging and evacuation may be performed. Purging may be performed by introducing $N_2$ gas as a purge gas supplied via a pipe (not illustrated) into the chamber 1 from the gas nozzle 27.

Cycle purging or high flow-rate purging is suitable as an evacuation and purging method. The cycle purging is a processing of repeating a process of raising the pressure by introducing, for example, $N_2$ gas as a purge gas into the chamber and a process of vacuum-evacuating the inside of the chamber plural times. In addition, the high flow-rate purging is a method of controlling the inside of the chamber to a predetermined pressure or higher by introducing, for example, $N_2$ gas as a purge gas into the chamber at a high flow rate, and then evacuating the inside of the chamber. Although both technologies have conventionally been used to remove particles in the chamber, and utilize the impact force caused when introducing the purge gas, these technologies do not have a sufficient ability to separate particles from the wall of the chamber.

On the other hand, in the present exemplary embodiment, the cycle purging or the high flow-rate purging is mainly used to discharge the particles removed by the first removal processing or the second removal processing, or by the first removal processing and the second removal processing to the outside of the chamber. That is, by floating the particles, separated from the chamber 1 by the first removal processing or the second removal processing or by the first removal processing and the second removal processing, using the impact force caused when introducing the purge gas, and thereafter, evacuating the inside of the chamber 1, the discharge of the particles to the outside of the chamber 1 is promoted. Of course, separation of some particles from the wall of the chamber occurs by the impact force of the purge gas of cycle purging or high flow-rate purging.

As a specific condition of the cycle purging, pressure at the time of pressure rising: approximately 0.3 MPa, pressure at the time of evacuation: 30 Pa, and the number of repetitions: 10 times are exemplified. In addition, as a specific condition of the high flow-rate purging, a required purging time: 0.1 to 10 seconds is exemplified.

The cycle purging or the high flow-rate purging may be performed only once after the first removal processing and/or the second removal processing is performed, but the first removal processing and/or the second removal processing and the cycle purging or the high flow-rate purging may be repeated plural times. This makes it possible to reduce the amount of particles and to obtain higher cleanliness.

2. Adsorption

As a method of discharging particles after removing the particles on the inner wall of the chamber 1 as described above, a method of introducing a dummy wafer into the chamber, adsorbing particles to the dummy wafer, and carrying out the dummy wafer may be used.

Figure 4:
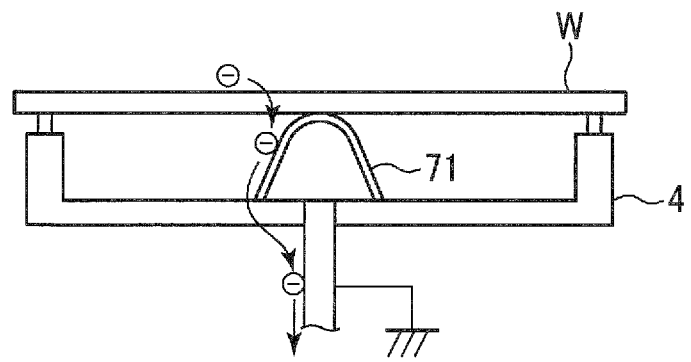
FIG. 4 is a view illustrating a state of grounding a wafer when blasting a gas cluster.
Figure 5A:
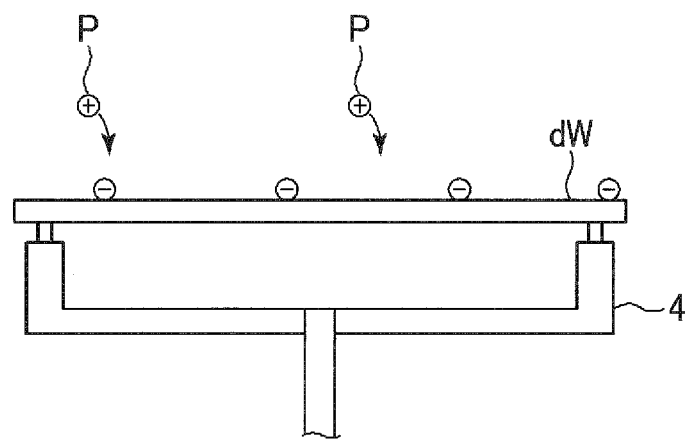
FIG. 5A is a view illustrating a state of electrically floating a dummy wafer without grounding in order to adsorb particles to the dummy wafer.
Figure 5B:
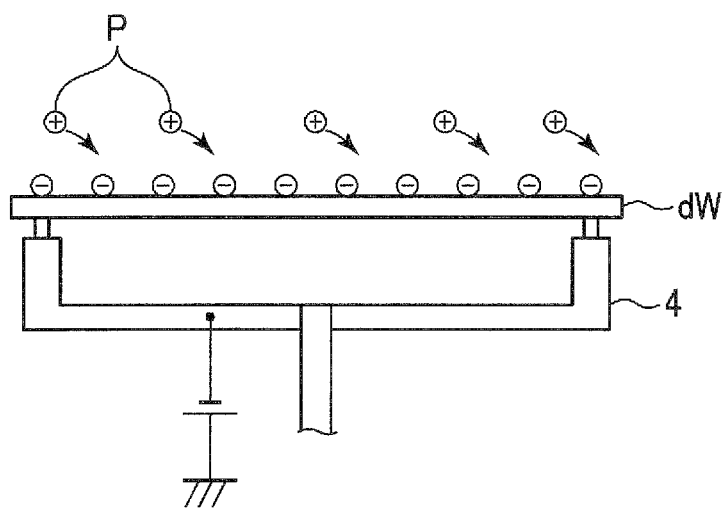
FIG. 5B is a view illustrating a state of actively charging the dummy wafer in order to adsorb particles to the dummy wafer.

It has been confirmed that a wafer is charged when blasting a gas cluster to the wafer. When blasting the gas cluster to the wafer, actually, as illustrated in FIG. 4, a ground wire 71 is connected to the wafer W, and the wafer W is connected to a ground via the rotary stage 4 so as to prevent particles from being electrically attracted to the wafer W. In this example, by using this principle, the dummy wafer dW is disposed on the rotary stage 4 at the time of chamber cleaning, and is electrically floated without being grounded, as illustrated in FIG. 5A, or is actively charged as illustrated in FIG. 5B (FIG. 5B illustrates a minus-charged state, but this is also in a case of a plus-charged state), particles in the chamber 1 are blown up by blasting a gas cluster or a gas stream, having energy that does not cause damage to the chamber, from the nozzle unit 13 to the wall (inner surface) of the chamber 1, and particles P charged with a reverse polarity, among the particles, are adsorbed by the dummy wafer dW. Then, by recovering the dummy wafer dW from the chamber 1, it is possible to effectively discharge the particles in the chamber 1.

Such an adsorption processing may be performed only once after the first removal processing and/or the second removal processing is performed, but the first removal processing and/or the second removal processing and the adsorption process may be repeated plural times. This makes it possible to reduce the amount of particles and to achieve higher cleanliness.

In addition, after the first removal processing and/or the second removal processing are performed, both the cycle purging or the high flow-rate purging and the adsorption processing may be performed.

<Other Applications>

Although the exemplary embodiments of the present disclosure have been described above, the present disclosure is not limited to the above-described exemplary embodiments, and various modifications are possible within the scope of the present disclosure. For example, the present disclosure is applied to a processing apparatus that performs a substrate cleaning processing in the above exemplary embodiment, but may be applied to any other substrate processing apparatus such as, for example, a dry etching apparatus that has a function of cleaning a substrate with a gas cluster or a substrate processing apparatus that performs a processing other than cleaning with a gas cluster.

In addition, the above-described exemplary embodiment illustrates a case where the nozzle unit is moved by pivoting in the substrate processing apparatus, but the nozzle unit may be linearly moved.

In addition, a processing target substrate is not limited to a semiconductor wafer, and it is to be understood that the present disclosure may also be applied to any other substrate such as, for example, a glass substrate used for a flat panel display (FPD) such as, for example, a liquid crystal display device, or a ceramic substrate.

DESCRIPTION OF SYMBOLS

| | |
|---|---|
| 1: chamber | 4: rotary stage |
| 5: rotating shaft | 6: motor |
| 7: elevating mechanism | 13: nozzle unit |
| 27: purge gas nozzle | 32: exhaust port |
| 33: exhaust pipe | 34: vacuum pump |
| 50: control unit | 60: reflecting plate |
| 71: ground line | 100: substrate processing apparatus |
| W: wafer | dW: dummy wafer |

What is claimed is:

1. A method for cleaning an inside of a chamber of a substrate processing apparatus that includes a chamber, a stage configured to hold a processing target substrate thereon in the chamber, and a nozzle unit configured to blast a gas cluster to the processing target substrate, and has a function of processing the processing target substrate by the gas cluster, the method comprising:

placing a predetermined reflecting member in the chamber; and removing particles adhered to the wall of the chamber by blasting the gas cluster to the reflecting member to generate a gas stream, and bringing the gas stream reflected from the reflecting member, into contact with a wall of the chamber.

2. The method of claim 1, wherein a dummy substrate is placed on the stage as the reflecting member, and particles adhered to a sidewall of the chamber is removed by blasting the gas cluster to the dummy substrate while moving the stage up and down, and bringing the gas stream, reflected from the dummy substrate, into contact with the sidewall of the chamber.

3. The method of claim 1, wherein a deformed reflecting plate is rotatably placed in the chamber as the reflecting member, and particles on an inner wall of the chamber are removed by blasting the gas cluster from the nozzle unit to the reflecting plate while rotating the reflecting plate and moving the nozzle unit, and bringing the gas stream, reflected from the reflecting plate in various directions, into contact with an entire inner wall of the chamber.

4. The method of claim 1, wherein as the reflecting member, a dummy substrate is placed on the stage and a deformed reflecting plate is rotatably placed in the chamber, and removing particles adhered to a side wall of the chamber by blasting the gas cluster to the dummy substrate while moving the stage up and down and bringing the gas stream, reflected from the dummy substrate, into contact with a sidewall of the chamber, and removing particles on an inner wall of the chamber by blasting the gas cluster from the nozzle unit to the reflecting plate while rotating the reflecting plate and moving the nozzle unit, and bringing the gas stream, reflected from the reflecting plate in various directions, into contact with the entire inner wall of the chamber are both performed.

5. A method for cleaning an inside of a chamber of a substrate processing apparatus that includes a chamber, a stage configured to hold a processing target substrate thereon in the chamber, and a nozzle unit configured to blast a gas cluster to the processing target substrate, and has a function of processing the processing target substrate by the gas cluster, the method comprising:
 a first stage including placing a predetermined reflecting member in the chamber, and removing particles adhered to the wall of the chamber by blasting the gas cluster to the reflecting member to generate a gas stream, and bringing the gas stream, reflected from the reflecting member, into contact with a wall of the chamber; and
 a second stage including discharging the removed particles from the chamber.

6. The method of claim 5, wherein, in the first stage, a dummy substrate is placed on the stage as the reflecting member, and particles adhered to a sidewall of the chamber is removed by blasting the gas cluster to the dummy substrate while moving the stage up and down, and bringing the gas stream, reflected from the dummy substrate, into contact with the sidewall of the chamber.

7. The method of claim 5, wherein, in the first stage, as the reflecting member, a deformed reflecting plate rotatably is placed in the chamber, and particles on an inner wall of the chamber are removed by blasting the gas cluster from the nozzle unit to the reflecting plate while rotating the reflecting plate and moving the nozzle unit, and bringing the gas stream, reflected from the reflecting plate in various directions, into contact with an entire inner wall of the chamber.

8. The method of claim 5, wherein, in the first stage, a dummy substrate is placed on the stage as the reflecting member, and a deformed reflecting plate is rotatably placed in the chamber and
 removing particles adhered to a side wall of the chamber by blasting the gas cluster to the dummy substrate while moving the stage up and down and bringing the gas stream, reflected from the dummy substrate, into contact with a sidewall of the chamber, and removing particles on an inner wall of the chamber by blasting the gas cluster from the nozzle unit to the reflecting plate while rotating the reflecting plate and moving the nozzle unit, and bringing the gas stream, reflected from the reflecting plate in various directions, into contact with the entire inner wall of the chamber are both performed.

9. The method of claim 5, wherein the second stage is performed by purging and evacuation in the chamber.

10. The method of claim 9, wherein the second stage is performed by cycle purging of repeating a process of raising a pressure by introducing a purge gas into the chamber and a process of vacuum-evacuating the inside of the chamber plural times, or by a high flow-rate purging of controlling the inside of the chamber to a predetermined pressure or higher by introducing the purge gas at a high flow rate into the chamber, and thereafter evacuating the inside of the chamber.

11. The method of claim 5, wherein the second stage is performed by disposing a dummy substrate in the chamber in a non-grounded state or in a minus-charged or plus-charged state, blasting the gas cluster or gas stream from the nozzle unit to the wall of the chamber, adsorbing particles in the chamber to the dummy substrate, and recovering the dummy substrate from the chamber.

12. The method of claim 5, wherein the first stage and the second stage are repeated plural times.

* * * * *